United States Patent [19]

Paterson et al.

[11] Patent Number: 5,566,186
[45] Date of Patent: Oct. 15, 1996

[54] TEST CONTROL DEVICE

[75] Inventors: Barry T. Paterson, Kilsyth; Kenneth D. Crocker, Cardross, both of United Kingdom

[73] Assignee: GEC-Marconi Avionics, Ltd., Middlesex, United Kingdom

[21] Appl. No.: 202,651

[22] Filed: Feb. 28, 1994

[30] Foreign Application Priority Data

Mar. 3, 1993 [GB] United Kingdom .................... 9304313

[51] Int. Cl.⁶ .................................................. G06F 11/00
[52] U.S. Cl. ............................................ 371/25.1; 371/27
[58] Field of Search ................................ 371/22.3, 22.4, 371/22.5, 22.6, 25.1, 27, 24

[56] References Cited

U.S. PATENT DOCUMENTS 4,760,330  7/1988  Lias, Jr. .
4,996,691  2/1991  Wilcox et al. .

FOREIGN PATENT DOCUMENTS 0065445  11/1982  European Pat. Off. .
2654519A  5/1991  France .

OTHER PUBLICATIONS

The ABC's of Boundary Scan Test © 1991 by Fluke®.

IEEE Standard Test Access Port and Boundary–Scan Architecture, IEEE Computer Society, Oct. 21, 1993.

*Primary Examiner*—Vincent P. Canney
*Attorney, Agent, or Firm*—Donald C. Casey

[57] ABSTRACT

A test control device for controlling the distribution of test data is connectable in parallel to a plurality of integrated circuits.

8 Claims, 3 Drawing Sheets

TEST CONTROL DEVICE

BACKGROUND OF THE INVENTION

This invention relates to a test control device designed to be connected to a plurality of integrated circuits each having an interface provided for the receipt and transmission of test data for verifying that the respective integrated circuit is functioning correctly.

The trend towards increasing functionality of integrated circuits has made testing of the devices by conventional techniques ever more difficult and it has been felt desirable to provide such devices with some means of testing whilst in situ. The Joint Test Action Group (JTAG) of Europe and North America has proposed a suitable architecture which has been incorporated into IEEE standard 1149.1.

DESCRIPTION OF THE PRIOR ART

It has been proposed to provide a device to be built into a circuit and which is operative to generate and control the distribution of interrogatory test data. However, the known device has only one output and one input port and requires the circuits to be tested to be connected in series in a ring network. This has the disadvantage that all the circuits must be in the test mode at the same time, entails a relatively long scan path and requires a large amount of processing capability.

BRIEF DESCRIPTION OF THE INVENTION

This invention provides a test control device designed to be connected to a plurality of integrated circuits each having an interface provided for the receipt and transmission of test data for verifying that the respective integrated circuit is functioning correctly, the device having a plurality of sets of ports, one set for each of the circuits to be tested so that the circuits may be connected to the device in parallel to one another.

The fact that the control device is connectable in parallel to the integrated circuits confers several advantages. For example, more frequent testing of the circuits can be provided than is the case if all the circuits are connected serially and allows a protocol to be provided in which several circuits can be tested simultaneously. For example data can be supplied to one of the circuits under test and, while that data is being processed by the respective circuit, the device can supply further test data to a further circuit or circuits before returning to the first circuit to read the processed data. This is because data can take as little as a few microseconds to be inputted, but a few milliseconds to process. Furthermore the device does not need as much processing capability as when the circuits are connected serially, and can allow the circuits not being tested to operate normally, while others are being tested, which is not possible with the known arrangements.

In a preferred embodiment the device includes a mask memory into which an expected response from a respective circuit can be placed and against which the actual response can be compared, the device being further operative to generate a status signal indicative of whether the actual response has passed or failed that comparison.

This feature is to be contrasted with the known test control devices in which the actual response is stored within a memory which must then be accessed by an external micro processor to perform the required evaluation. The use of a mask memory as defined allows a simple pass/fail test to be provided requiring little processing capability.

The device preferably further includes a main memory into which received test data can be stored for access by external microprocessor means. This feature is of use where it is necessary to ascertain the location of nature of a fault, as opposed to merely indicating that a fault exists.

BRIEF DESCRIPTION OF THE DRAWINGS

In order that the invention may be well understood, and embodiment thereof will now be described by way of example with reference to the accompanying diagrammatic drawings, in which.

DETAILED DESCRIPTION OF THE PREFERRED EMBODIMENT

Figure 1:
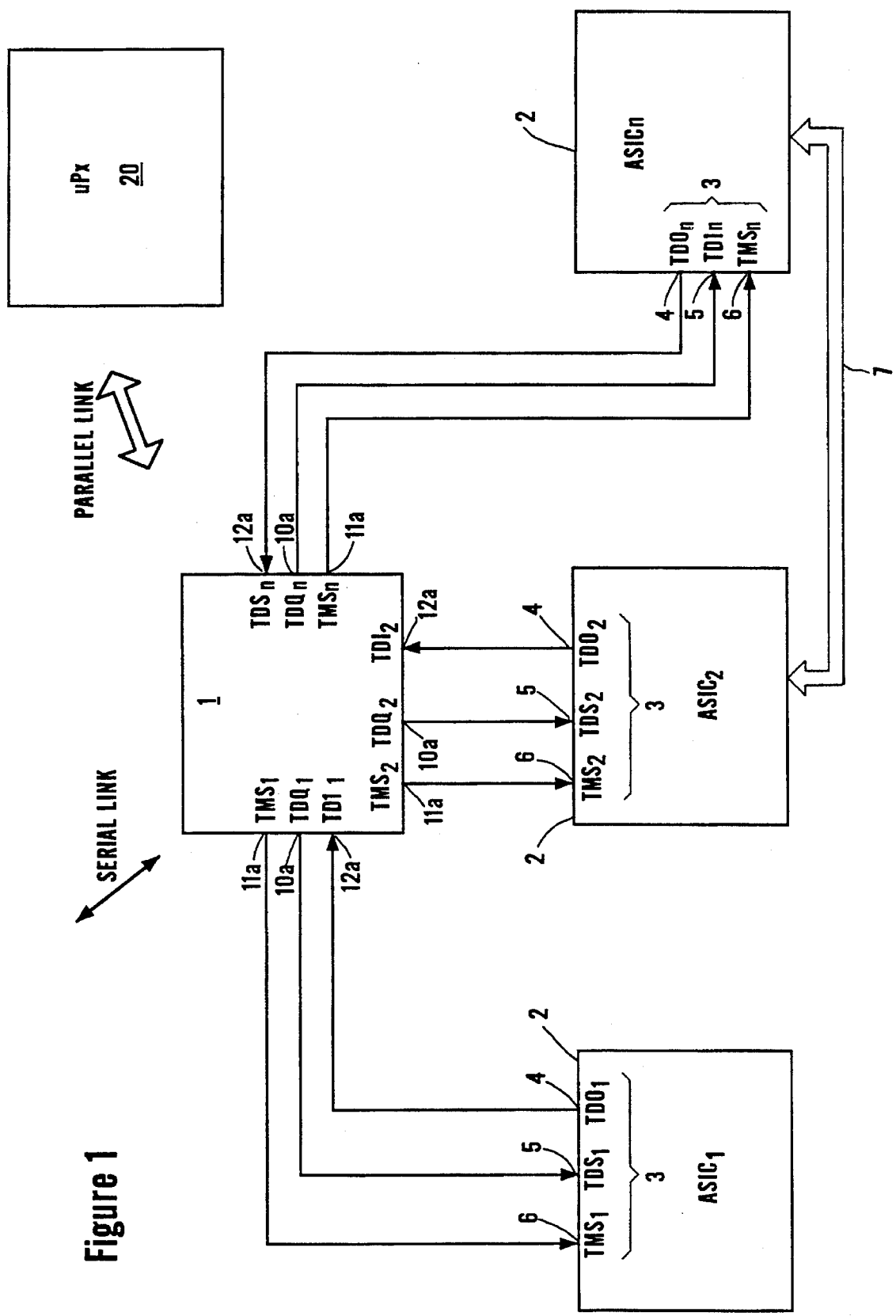
FIG. 1 shows schematically a control device connected to other circuitry.

As shown in FIG. 1, a test control device 1 is connected to a plurality of Application Specific Integrated Circuits (ASIC's) 2. According to the JTAG architecture disclosed in IEEE 1149.1, the disclosure of which is hereby incorporated, each ASIC 2 has a port 3 having at least three pins for connection to the test control device 1. According to the protocol used in IEEE 1149.1, these are labelled TDO (Test Data Out) 4, TDI (Test Data In) 5, and TMS (Test Mode Select) 6. For the purposes of the invention it is not necessary to describe in detail the internal structure of the interface located within each ASIC 2. Essentially, each contains control and logic circuitry by which test data, i.e. a digital word, can be input on the respective TDI pin 5. The word is then processed by the ASIC to give a response which is output on the TDO pin 4. A variety of tests can be performed and these can be selected by applying an appropriate signal on the TMS pin. Other pins (not shown in FIG. 1) may additionally be connected to the control device, operable, for example, for clock and reset functions.

In addition to verifying if the ASIC's are functioning correctly, the control device 1 can also be used to perform boundary scan functions—essentially for checking that the interconnections, shown schematically by databus 7, between ASIC's are continuous.

Figure 2:
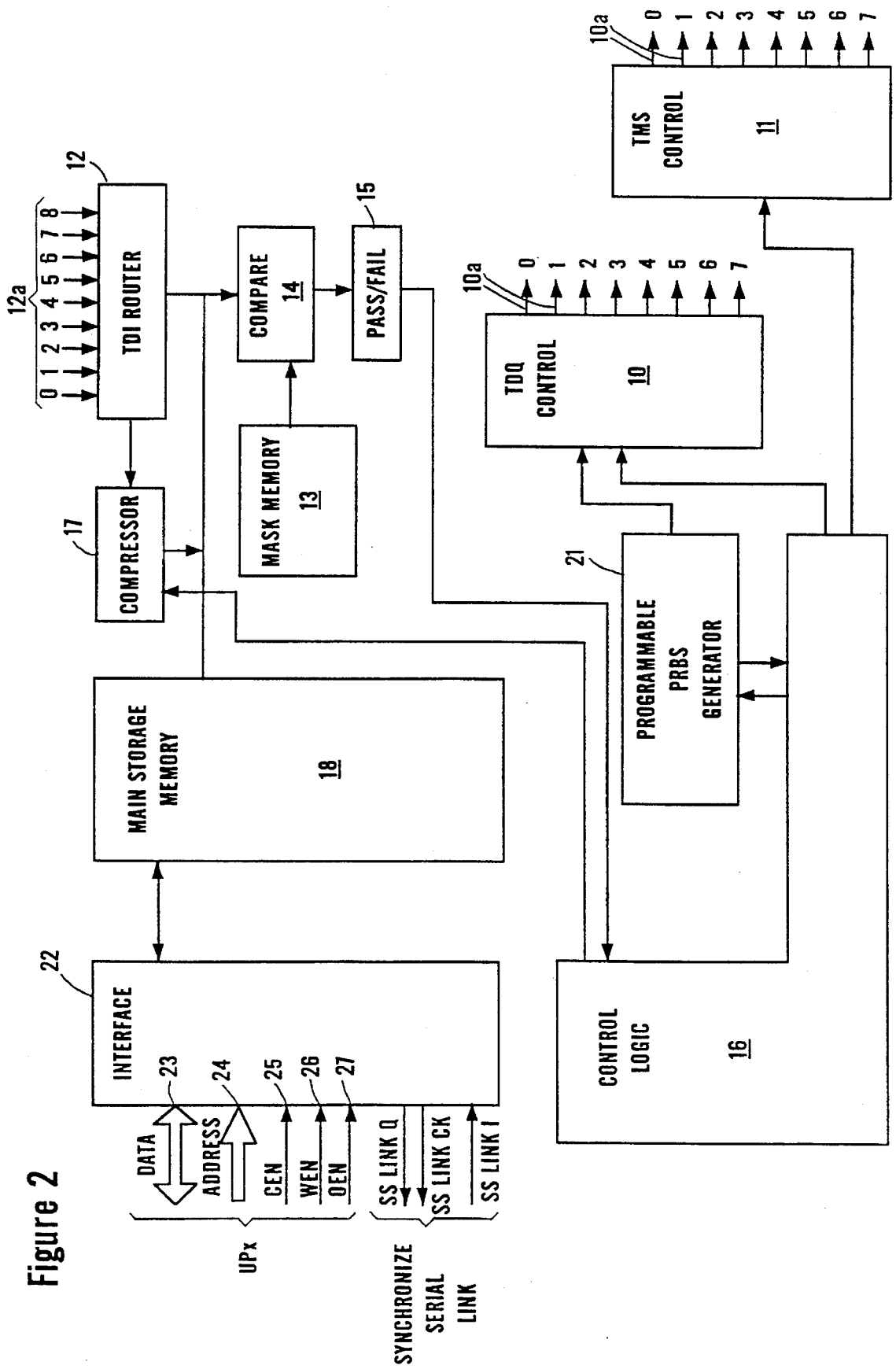
FIG. 2 is a schematic block diagram of the control device shown in FIG. 1.

As shown in FIG. 2, the device is connectable to eight ASIC's 2 and accordingly has eight output pins 10a connected to the TDQ (Test Data Out) control circuitry 10 and a further eight pins 11a connected to the TMS control circuitry 11. Nine pins 12a are provided for the receipt of data on the TDI control circuitry 12.

A variety of tests can be performed on the incoming data. In one mode, a mask memory 13 is loaded with an expected return signature and this is then compared with the actual signature by a comparator 14. According to whether the two signatures match, a generator 15 produces an error flag which is sent to the device control logic 16.

Usually, ASIC's having the JTAG interface referred to previously include a compressor at the output stage which can compress the data to be sent to the control device. This function, in effect, selects every n'th bit from a word to give a signature representative of that word. However, some ASIC's, for example memories, lack this feature and for this reason the control device includes a compressor 17 by which a relatively shorter signature can be retrieved from a relatively longer stream of data. This compressed data can then be compared with an expected return using the mask memory 13 described previously.

The mask memory 13 can be used to detect whether a fault exists with the ASIC, or with the link between components, but is not able to detect the location of that fault, i.e. the particular bit or bits within the signature which are in error. For this reason, the device additionally includes a main storage memory 18 into which raw or compressed data can be input for access by an external microprocessor 20 (FIG. 1). The device also includes a programmable pseudo random binary sequence generator (PRBS) 21. Under the control of the control logic 16, binary sequences of variable length can be generated. For example, different sizes of memory require different length of word to check all of their memory locations. If an unnecessarily long word is used, it may not be possible to test all the address locations during the number of clock cycles allocated to that test, or if an appropriate number of clock cycles is used, a full test may take an unnecessarily long time.

An interface 22 is provided to enable the device to be connected to the external micro processor 20. The interface 22 includes an eight bit bidirectional databus 23 and a nine bit address bus 24. Further pins 25, 26, 27 are provided for chip, write and output enable functions respectively. A synchronous serial link includes an input pin 28 and clock and output pins 29, 30 respectively for connecting the device to external test equipment, or to a further built-in microprocessor. In this way, the host micro processor 20 can itself be tested, if required.

Figure 3:
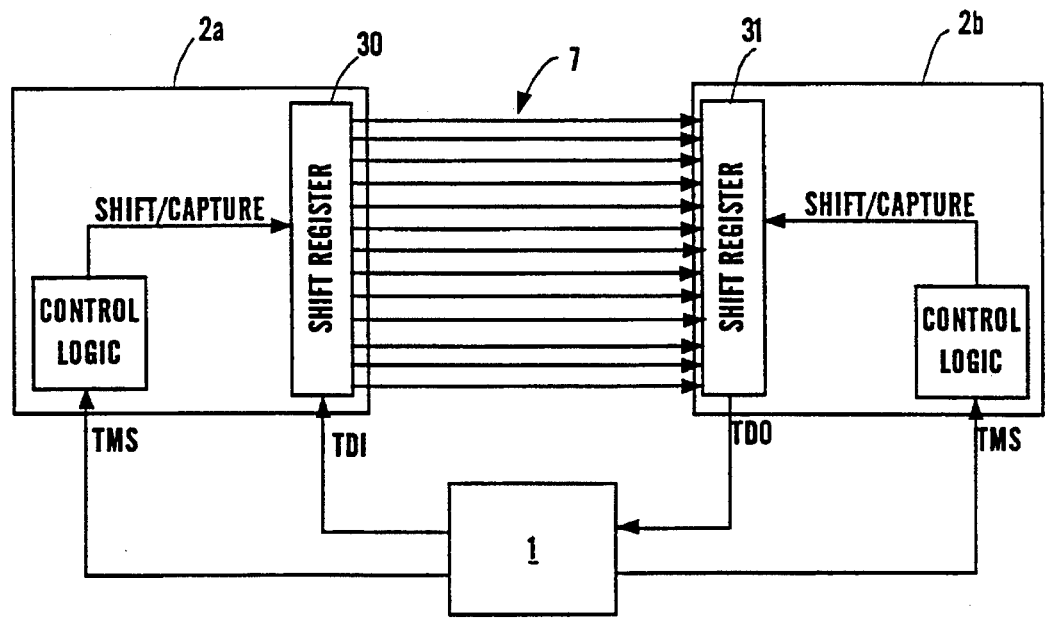
FIGS. 3 and 4 show schematically ways in which the device can be connected to the circuitry to be tested.
Figure 4:
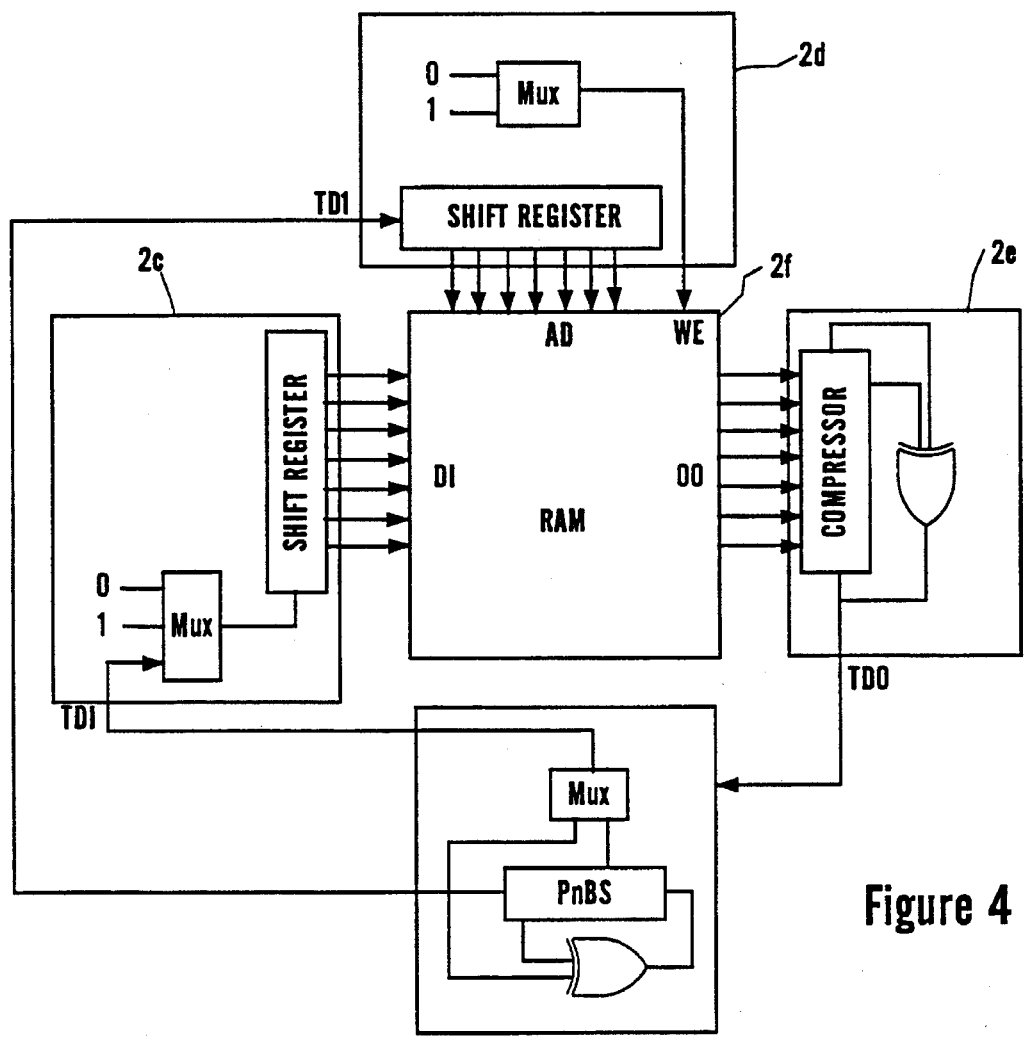

FIGS. 3 and 4 show schematically ways in which the device 1 can be connected to ASIC's. In FIG. 3, a data generator ASIC 2a is connected by a databus 7 to a data analyser ASIC 2b. The control device 1 applies data to shift register 30 in ASIC 2a and this is then read from shift register 31 in ASIC 2b. The outcoming data can be sent to the mask memory 13, if it is desired merely to test whether a fault exists with the databus 7, or alternatively can be sent to the main storage memory if it is necessary to ascertain on which line the fault exists.

FIG. 4 shows one way in which a Random Access Memory (RAM) 2f can be tested. ASIC 2c is provided for writing data into the RAM 2f, ASIC 2d is provided for specifying the address of that data, which can be accessed via ASIC 2e. The device 1 applies data on the TDI pins of ASIC's 2c and 2d and this data is compressed by compressor 32 and read from the TDO pin on ASIC 2e.

The test control device 1 described is preferably formed as a solid state device using CMOS technology encapsulated in a surface mounting package having sixty eight pins.

We claim:

1. A test control device designed to be connected to a plurality of integrated circuits each having an interface provided for the receipt and transmission of test data for verifying that the respective integrated circuit is functioning correctly, the device having a plurality of sets of ports, one set for each of the circuits to be tested so that the circuits may be connected to the device in parallel to one another.

2. A test control device according to claim 1 including means to test the circuits simultaneously.

3. A test control device according to claim 1 including means operative to send data to a first circuit, then to send data to a second circuit and then to read data from the first circuit.

4. A test control device according to claim 1 including a mask memory into which an expected response from a respective circuit can be placed and against which the actual response can be compared, the device being arranged to generate a status signal indicative of whether the actual response has passed or failed that comparison.

5. A test control device according to claim 1 including a main memory into which received test data can be stored for access by external micro processor means.

6. A test control device according to claim 1 including means for generating a data stream of variable length appropriate to the circuit under test.

7. A test control device according to claim 1 including means for compressing incoming data so as to retrieve a relatively shorter signature from a relatively longer stream of data.

8. A test control device according to claim 1 including a serial interface for applying control data to the device.

* * * * *